(12) United States Patent
Park et al.

(10) Patent No.: US 11,721,575 B2
(45) Date of Patent: Aug. 8, 2023

(54) SUBSTRATE SUPPORT UNIT AND SUBSTRATE TREATING APPARATUS HAVING THE SAME

(71) Applicant: SEMES CO., LTD., Cheonan-si (KR)

(72) Inventors: Inhwang Park, Suwon-si (KR); Gui Su Park, Cheonan-si (KR); Young Hun Lee, Cheonan-si (KR); Youngseop Choi, Cheonan-si (KR); Seung Hoon Oh, Cheonan-si (KR); Jonghyeon Woo, Asan-si (KR); Jin Mo Jae, Geoje-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 472 days.

(21) Appl. No.: 16/906,237

(22) Filed: Jun. 19, 2020

(65) Prior Publication Data

US 2020/0402836 A1 Dec. 24, 2020

(30) Foreign Application Priority Data

Jun. 21, 2019 (KR) .................. 10-2019-0074238

(51) Int. Cl.
*H01L 21/687* (2006.01)
*B08B 3/04* (2006.01)
*H01L 21/67* (2006.01)

(52) U.S. Cl.
CPC .......... *H01L 21/68785* (2013.01); *B08B 3/04* (2013.01); *H01L 21/67051* (2013.01); *H01L 21/67126* (2013.01); *H01L 21/68792* (2013.01)

(58) Field of Classification Search
None
See application file for complete search history.

(56) References Cited

U.S. PATENT DOCUMENTS

| 6,276,378 B1 | 8/2001 | Taniyama et al. |
| 2013/0319457 A1* | 12/2013 | Lee ............ H01L 21/02052 134/1 |

FOREIGN PATENT DOCUMENTS

| JP | H8-124288 A | 5/1996 |
| JP | 2013-251548 A | 12/2013 |
| KR | 10-2009-0015332 A | 2/2009 |
| KR | 10-2013-0076466 A | 7/2013 |
| KR | 10-2015-0042133 A | 4/2015 |
| KR | 10-2016-0066340 A | 6/2016 |
| KR | 10-2016-0102158 A | 8/2016 |
| WO | WO-2018/030254 A1 | 2/2018 |

OTHER PUBLICATIONS

Clarivate Analytics translation KR 2016-0102158A, Magnetic Fluid Sealing Apparatus, Shimazaki (Year: 2016).*

(Continued)

*Primary Examiner* — Cristi J Tate-Sims
(74) *Attorney, Agent, or Firm* — Harness, Dickey & Pierce, P.L.C.

(57) ABSTRACT

An apparatus for supporting a substrate includes a rotatable spin head that supports the substrate, a hollow shaft that is connected with the spin head and that transmits torque to the spin head, a nozzle assembly that is disposed in an interior space of the spin head so as not to rotate and that supplies a treatment liquid to a backside of the substrate, and a sealing member that seals a gap between the spin head and the nozzle assembly using a magnetic fluid.

9 Claims, 8 Drawing Sheets

(56) References Cited

OTHER PUBLICATIONS

Clarivate Analytics translation KR101349331, Sealing Apparatus Using Magnetic Fluid, Jeong (Year: 2014).*
Office Action for Japanese Application No. 2020-102339 dated Aug. 2, 2022.
Office Action for Korean Application No. 2020-102339 dated Aug. 2, 2022.
Notice of Allowance for Korean Application No. 10-2019-0074238 dated Apr. 9, 2021.

* cited by examiner

SUBSTRATE SUPPORT UNIT AND SUBSTRATE TREATING APPARATUS HAVING THE SAME

CROSS-REFERENCE TO RELATED APPLICATIONS

A claim for priority under 35 U.S.C. § 119 is made to Korean Patent Application No. 10-2019-0074238 filed on Jun. 21, 2019, in the Korean Intellectual Property Office, the entire contents of which are hereby incorporated by reference.

BACKGROUND

Embodiments of the inventive concept described herein relate to an apparatus for treating a substrate.

To manufacture semiconductor devices, thin films are formed on a semiconductor substrate. Cleaning processes are essential for the formation of the thin films. A thin film deposited on the backside of the substrate acts as foreign matter in subsequent processes. Therefore, a cleaning process of removing foreign matter such as the thin film on the backside of the substrate by using a single-substrate treating apparatus is very important.

In general, the substrate treating apparatus includes a spin head on which the substrate is seated. The spin head is rotated by torque generated from a drive motor. Accordingly, the substrate seated on the spin head is rotated. A back nozzle is vertically installed through the center of the spin head. A cover is provided on an upper end portion of the back nozzle. The cover covers the center of the spin head and a surrounding area around the center of the spin head. The cover has a plurality of holes formed therein, and a chemical is dispensed to the backside of the substrate through the holes to perform a cleaning process.

A bearing for rotation is applied to the spin head of the substrate treating apparatus to support the back nozzle unit. However, when the substrate is rotated, negative pressure lower than the atmospheric pressure is formed on a central portion of the substrate, and due to the negative pressure, particles generated when the bearing is rotated flow backward through a gap between the back nozzle unit and the spin head to contaminate the backside of the substrate.

Furthermore, when the chemical falling down to the top side of the spin head is introduced into the gap between the spin head and the back nozzle, the bearing may be corroded and damaged by the chemical introduced into the gap.

SUMMARY

Embodiments of the inventive concept provide a substrate support unit for blocking infiltration of a chemical into a gap between a body of a spin head and a back nozzle, and a substrate treating apparatus having the substrate support unit.

Embodiments of the inventive concept provide a substrate support unit for blocking a reverse flow of bearing-induced particles through a gap between a body of a spin head and a back nozzle, and a substrate treating apparatus having the substrate support unit.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for supporting a substrate includes a rotatable spin head that supports the substrate, a hollow shaft that is connected with the spin head and that transmits torque to the spin head, a nozzle assembly that is disposed in an interior space of the spin head so as not to rotate and that supplies a treatment liquid to a backside of the substrate, and a sealing member that seals a gap between the spin head and the nozzle assembly using a magnetic fluid.

The sealing member includes a magnetic body that is installed on an outer surface of a main body of the nozzle assembly and that forms a magnetic field, pole pieces that are installed around the magnetic body and that transmit a magnetic flux line of the magnetic body to the spin head, and the magnetic fluid that seals a gap between the pole pieces and the spin head by a magnetic force transmitted by the pole pieces.

The spin head may include inward protrusions protruding from an inner surface of a hollow portion of the spin head to make the magnetic flux line of the magnetic body, in which the inner surface faces the pole pieces.

The pole pieces may include outward protrusions protruding from an outer surface of the magnetic body to make the magnetic flux line of the magnetic body, in which the outer surface faces the inward protrusions.

A gap between the inward protrusions and the pole pieces may be narrower than the gap between the spin head and the nozzle assembly.

The pole pieces may be provided at an upper end and a lower end of the magnetic body along a lengthwise direction of the hollow shaft.

According to an exemplary embodiment, an apparatus for treating a substrate includes a cup having a process space therein, a support unit that supports the substrate in the process space, and a fluid supply unit that supplies a treatment fluid to the substrate supported on the support unit. The support unit includes a rotatable spin head that supports the substrate, a hollow shaft that is connected with the spin head and that transmits torque to the spin head, a back nozzle assembly that is disposed in an interior space of the spin head so as not to rotate and that supplies a treatment liquid to a backside of the substrate, and a sealing member that seals a gap between the spin head and the back nozzle assembly using a magnetic fluid.

The sealing member may include a magnetic body that is installed in a recess formed on an outer surface of a main body of the back nozzle assembly and that forms a magnetic field, pole pieces that are installed around the magnetic body and that transmit a magnetic flux line of the magnetic body to the spin head, and the magnetic fluid that seals a gap between the pole pieces and the spin head by a magnetic force transmitted by the pole pieces.

The spin head may include inward protrusions protruding from an inner surface of a hollow portion of the spin head to make the magnetic flux line of the magnetic body, in which the inner surface faces the pole pieces.

The pole pieces may include outward protrusions protruding from an outer surface of the magnetic body to make the magnetic flux line of the magnetic body, in which the outer surface faces the inward protrusions.

A gap between the inward protrusions and the pole pieces may be narrower than the gap between the spin head and the nozzle assembly, and the pole pieces may be provided at an upper and a lower end of the magnetic body along a lengthwise direction of the hollow shaft.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

As the inventive concept allows for various changes and numerous embodiments, exemplary embodiments will be illustrated in the drawings and described in detail in the written description. However, this is not intended to limit the inventive concept to particular modes of practice, and it should be appreciated that all changes, equivalents, and substitutes that do not depart from the spirit and scope of the inventive concept are encompassed in the inventive concept. In describing the inventive concept, detailed descriptions related to well-known functions or configurations will be omitted when they may make subject matters of the inventive concept obscure.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

The terms such as first, second, and the like may be used to describe various components, but the components should not be limited by the terms. The terms may be used only for distinguishing one component from others.

Hereinafter, embodiments according to the inventive concept will be described in detail with reference to the accompanying drawings. In describing the embodiments with reference to the accompanying drawings, identical or corresponding components are provided with identical reference numerals in the drawings regardless of the reference numerals, and repetitive descriptions thereof will be omitted.

Figure 1:
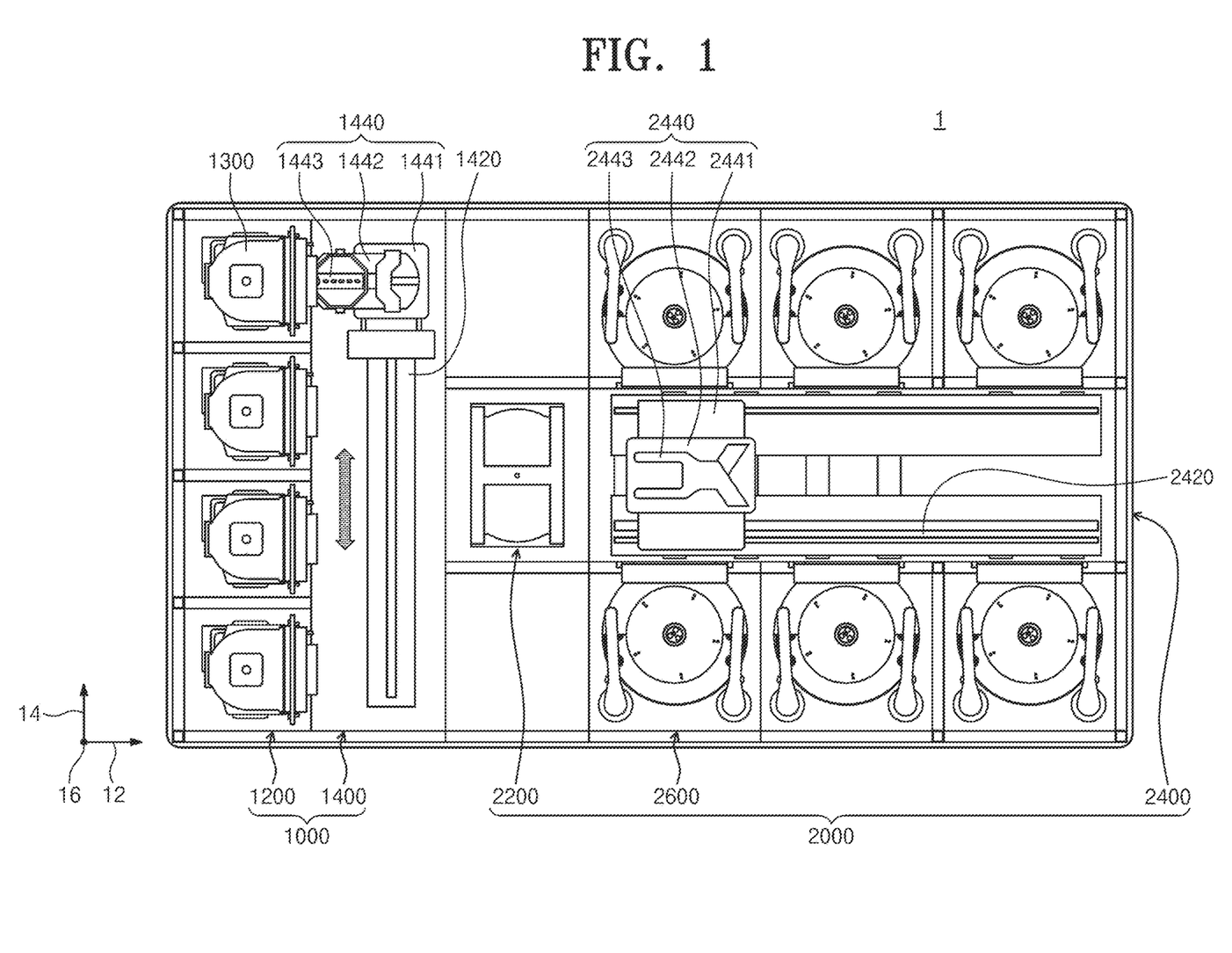
FIG. 1 is a schematic plan view illustrating substrate treating equipment of the inventive concept.

FIG. 1 is a schematic plan view illustrating substrate treating equipment 1 of the inventive concept.

Referring to FIG. 1, the substrate treating equipment 1 includes an index module 1000 and a process module 2000. The index module 1000 includes a load port 1200 and a transfer frame 1400. The load port 1200, the transfer frame 1400, and the process module 2000 are sequentially arranged in a row. Hereinafter, the direction in which the load port 1200, the transfer frame 1400, and the process module 2000 are arranged is referred to as a first direction 12. A direction perpendicular to the first direction 12 when viewed from above is referred to as a second direction 14, and a direction perpendicular to the plane including the first direction 12 and the second direction 14 is referred to as a third direction 16.

A carrier 1300 having substrates W received therein is placed on the load port 1200. A plurality of load ports 1200 are provided. The load ports 1200 are disposed in a row along the second direction 14. FIG. 1 illustrates an example that the index module 10000 includes four load ports 1200. However, the number of load ports 1200 may be increased or decreased depending on conditions such as the process efficiency and footprint of the process module 2000. Slots (not illustrated) that support edges of the substrates W are formed in the carrier 1300. The slots are arranged in the third direction 16. The substrates W are stacked in the carrier 1300 in a state of being spaced apart from each other along the third direction 16. A front opening unified pod (FOUP) may be used as the carrier 1300.

The process module 2000 includes a buffer unit 2200, a transfer chamber 2400, and process chambers 2600. The transfer chamber 2400 is disposed such that the lengthwise direction thereof is parallel to the first direction 12. The process chambers 2600 are disposed on one side and an opposite side of the transfer chamber 2400 along the second direction 14. The process chambers 2600 on the one side of the transfer chamber 2400 and the process chambers 2600 on the opposite side of the transfer chamber 2400 are located in a symmetric arrangement with respect to the transfer chamber 2400. Some of the process chambers 2600 are disposed along the lengthwise direction of the transfer chamber 2400. Furthermore, other process chambers 2600 are stacked one above another. That is, the process chambers 2600 may be disposed in an A×B array (A and B being natural numbers of 1 or larger) on the one side of the transfer chamber 2400. Here, "A" is the number of process chambers 2600 provided in a row along the first direction 12, and "B" is the number of process chambers 2600 provided in a column along the third direction 16. When four or six process chambers 2600 are provided on the one side of the transfer chamber 2400, the process chambers 2600 may be arranged in a 2×2 or 3×2 array. The number of process chambers 2600 may be increased or decreased. Alternatively, the process chambers 2600 may be provided on only the one side of the transfer chamber 2400. In another case, the process chambers 2600 may be provided in a single layer on the one side and the opposite side of the transfer chamber 2400.

The buffer unit 2200 is disposed between the transfer frame 1400 and the transfer chamber 2400. The buffer unit 2200 provides a space in which the substrates W stay before transferred between the transfer chamber 2400 and the transfer frame 1400. The buffer unit 2200 has slots (not illustrated) on which the substrates W are placed. The slots (not illustrated) are spaced apart from each other along the third direction 16. The buffer unit 2200 is open at one side opposite the transfer frame 1400 and at an opposite side opposite the transfer chamber 2400.

The transfer frame 1400 transfers the substrates W between the carriers 1300 placed on the load ports 1200 and the buffer unit 2200. An index rail 1420 and an index robot 1440 are provided in the transfer frame 1400. The index rail 1420 is disposed such that the lengthwise direction thereof is parallel to the second direction 14. The index robot 1440 is installed on the index rail 1420 and rectilinearly moves along the index rail 1420 in the second direction 14. The index robot 1440 has a base 1441, a body 1442, and an index arm 1443. The base 1441 is installed so as to be movable along the index rail 1420. The body 1442 is coupled to the base 1441. The body 1442 is movable on the base 1441 along the third direction 16. Furthermore, the body 1442 is rotatable on the base 1441. The index arm 1443 is coupled to the body 1442 and is movable forward and backward relative to the body 1442. A plurality of index arms 1443 are provided. The index arms 1443 are individually driven. The index arms 1443 are stacked one above another along the third direction 16 with a spacing gap therebetween. Some of the index arms 1443 may be used to transfer the substrates W from the process module 2000 to the carriers 1300, and the other index arms 1443 may be used to transfer the substrates W from the carriers 1300 to the process module 2000. Accordingly, particles generated from the substrates W that are to be treated may be prevented from adhering to the treated substrates W in a process in which the index robot 1440 transfers the substrates W between the carriers 130 and the process module 2000.

The transfer chamber 2400 transfers the substrates W between the buffer unit 2200 and the process chambers 2600 and between the process chambers 2600. A guide rail 2420 and a main robot 2440 are provided in the transfer chamber 2400. The guide rail 2420 is disposed such that the lengthwise direction thereof is parallel to the first direction 12. The main robot 2440 is installed on the guide rail 2420 and rectilinearly moves on the guide rail 2420 along the first direction 12. The main robot 2440 has a base 2441, a body 2442, and a main arm 2443. The base 2441 is installed so as to be movable along the guide rail 2420. The body 2442 is coupled to the base 2441. The body 2442 is movable on the base 2441 along the third direction 16. Furthermore, the body 2442 is rotatable on the base 2441. The main arm 2443 is coupled the body 2442 and is movable forward and backward relative to the body 2442. A plurality of main arms 2443 are provided. The main arms 2443 are individually driven. The main arms 2443 are stacked one above another along the third direction 16 with a spacing gap therebetween. The main arms 2443 used to transfer the substrates W from the buffer unit 2200 to the process chambers 2600 may differ from the main arms 2443 used to transfer the substrates W from the process chambers 2600 to the buffer unit 2200.

Each of the process chambers 2600 has a substrate treating apparatus 10 therein in which a cleaning process is performed on a substrate W. The substrate treating apparatuses 10 in the respective process chambers 2600 may have different structures depending on the types of cleaning processes performed by the substrate treating apparatuses 10. Selectively, the substrate treating apparatuses 10 in the respective process chambers 2600 may have the same structure. Selectively, the process chambers 2600 may be divided into a plurality of groups. The substrate treating apparatuses 10 in the process chambers 2600 belonging to the same group may have the same structure, and the substrate treating apparatuses 10 in the process chambers 2600 belonging to different groups may have different structures. For example, in a case where the process chambers 2600 are divided into two groups, a first group of process chambers 2600 may be disposed on the one side of the transfer chamber 2400, and a second group of process chambers 2600 may be disposed on the opposite side of the transfer chamber 2400. Selectively, on the opposite sides of the transfer chamber 2400, the first group of process chambers 2600 may be provided in a lower layer, and the second group of process chambers 2600 may be provided in an upper layer. The first group of process chambers 2600 may be distinguished from the second group of process chambers 2600 depending on the types of chemicals used and the types of cleaning processes.

In the following embodiment, an apparatus for performing a cleaning process, a stripping process, and an organic residue removal process on a substrate W by using treatment fluids such as an ozone treatment fluid containing ozone, a rinsing solution, and a drying gas will be described.

Figure 2:
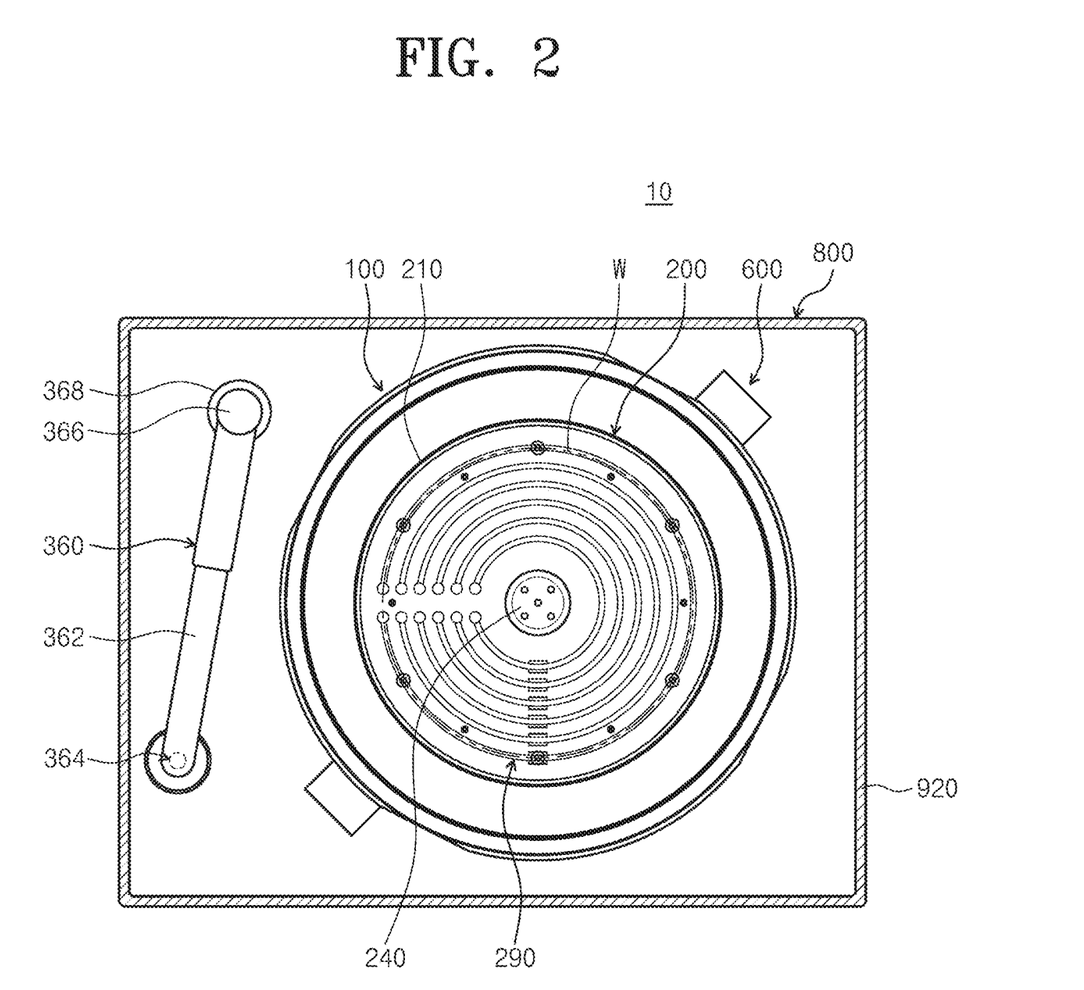
FIG. 2 is a plan view illustrating a substrate treating apparatus of FIG. 1.
Figure 3:
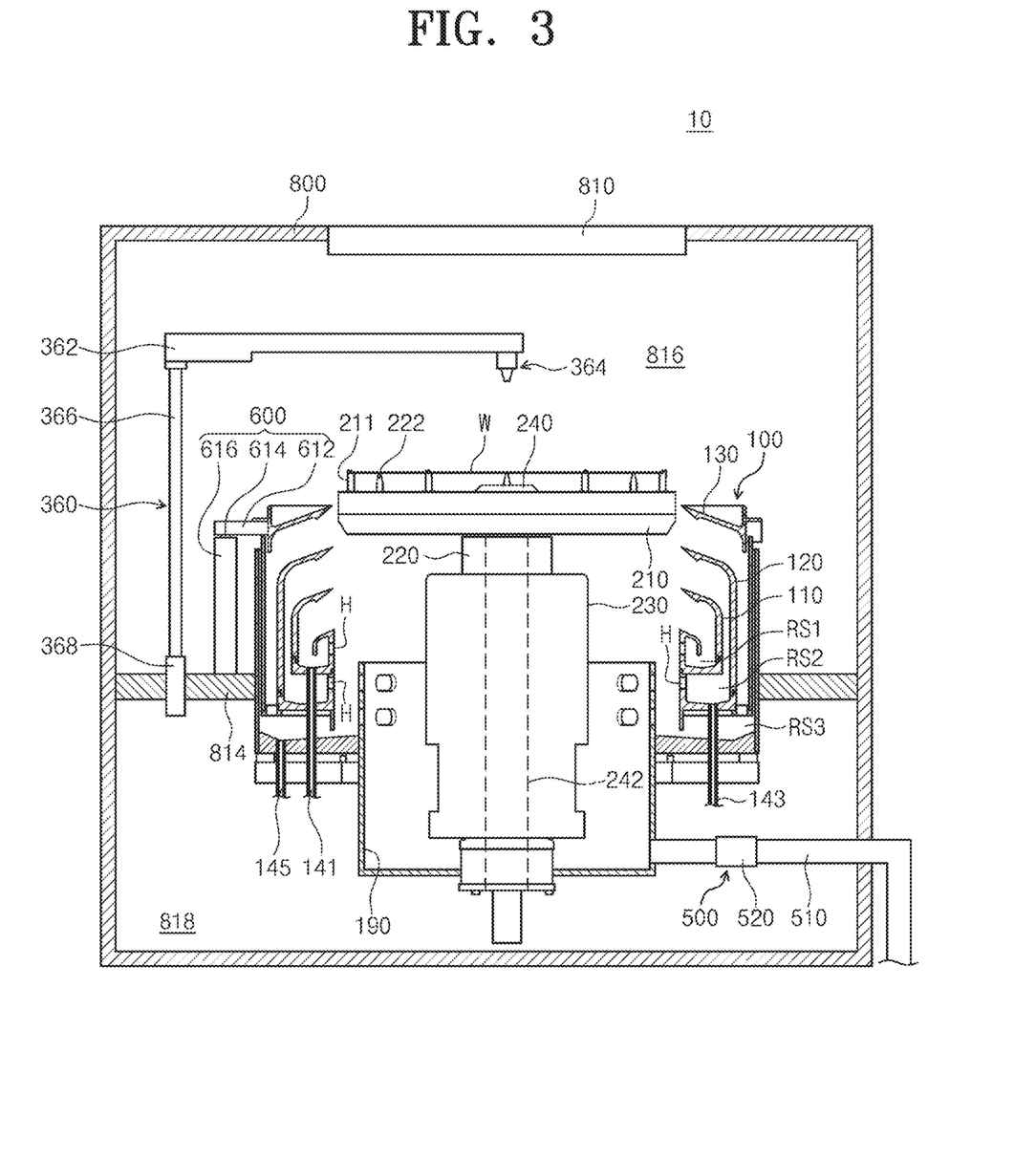
FIG. 3 is a sectional view illustrating the substrate treating apparatus of FIG. 1.

FIG. 2 is a plan view illustrating the substrate treating apparatus of FIG. 1, and FIG. 3 is a sectional view illustrating the substrate treating apparatus of FIG. 1.

Referring to FIGS. 2 and 3, the substrate treating apparatus 10 includes a chamber 800, a processing vessel 100, a substrate support unit 200, a heating unit 290, a fluid supply unit 300, a process exhaust unit 500, and a lifting unit 600.

The chamber 800 has a sealed interior space. The chamber 800 is equipped with an air-flow supply unit 810 at the top thereof. The air-flow supply unit 810 forms a downward air flow in the chamber 800.

The air-flow supply unit 810 filters and supplies high-humidity outside air into the chamber 800. The high-humidity outside air forms a downward air flow while being supplied into the chamber 800 through the air-flow supply unit 810. The downward air flow provides a uniform air flow over the substrate W and releases contaminants, which are generated in a process in which the surface of the substrate W is treated by the treatment fluids, along with air to the process exhaust unit 500 through recovery bowls 110, 120, and 130 of the processing vessel 100.

The chamber 800 is partitioned into a process area 816 and a maintenance area 818 by a horizontal partition wall 814. The processing vessel 100 and the substrate support unit 200 are located in the process area 816. In addition to an exhaust line 510 and drain lines 141, 143, and 145 connected with the processing vessel 100, an actuator of the lifting unit 600, an actuator connected with the fluid supply unit 300, and a supply line are located in the maintenance area 818. The maintenance area 818 is isolated from the process area 816.

The processing vessel 100 has an open-topped cylindrical shape and provides a process space for treating the substrate W. The open top side of the processing vessel 100 serves as a passage through which the substrate W is carried into or out of the processing vessel 100. The substrate support unit 200 is located in the process space. The substrate support unit 200 rotates the substrate W while supporting the substrate W during a process.

The processing vessel 100 has, at the bottom thereof, a lower space to which an exhaust duct 190 is connected to perform forced exhaust. The processing vessel 100 includes the first to third recovery bowls 110, 120, and 130 that are disposed in multiple stages and that take in treatment liquids and gas scattered over the rotating substrate W.

The first to third annular recovery bowls 110, 120, and 130 have exhaust holes H that connect to one common annular space.

Specifically, each of the first to third recovery bowls 110, 120, and 130 includes a bottom wall having an annular ring shape and a sidewall having a cylindrical shape extending from the bottom wall. The second recovery bowl 120 surrounds the first recovery bowl 110 and is spaced apart from the first recovery bowl 110. The third recovery bowl 130 surrounds the second recovery bowl 120 and is spaced apart from the second recovery bowl 120.

The first to third recovery bowls 110, 120, and 130 have first to third recovery spaces RS1, RS2, and RS3, respectively, into which a gas flow containing the treatment liquids and fumes scattered from the substrate W is introduced. The first recovery space RS1 is defined by the first recovery bowl 110, the second recovery space RS2 is defined by the spacing space between the first recovery bowl 110 and the second recovery bowl 120, and the third recovery space RS3 is defined by the spacing space between the second recovery bowl 120 and the third recovery bowl 130.

The top side of each of the first to third recovery bowls 110, 120, and 130 is open in the center. The first to third recovery bowls 110, 120, and 130 each include an inclined wall that is upwardly inclined such that the distance between the inclined wall and the corresponding bottom wall gradually increases from the sidewall to the open top side. The treatment liquids scattered from the substrate W flow into the recovery spaces RS1, RS2, and RS3 along the top sides of the first to third recovery bowls 110, 120, and 130.

A first treatment liquid introduced into the first recovery space RS1 is discharged to the outside through the first recovery line 141. A second treatment liquid introduced into the second recovery space RS2 is discharged to the outside through the second recovery line 143. A third treatment liquid introduced into the third recovery space RS3 is discharged to the outside through the third recovery line 145.

The process exhaust unit 500 is responsible for evacuation of the processing vessel 100. For example, the process exhaust unit 500 applies exhaust pressure (suction pressure) to a recovery bowl that recovers a treatment liquid during a process, among the first to third recovery bowls 110, 120, and 130. The process exhaust unit 500 includes the exhaust line 510 connected with the exhaust duct 190 and a damper 520. The exhaust line 510 receives exhaust pressure from an exhaust pump (not illustrated) and is connected with a main exhaust line buried beneath the floor of a semiconductor manufacturing line.

The processing vessel 100 is combined with the lifting unit 600 that changes the vertical position of the processing vessel 100. The lifting unit 600 rectilinearly moves the processing vessel 100 in the vertical direction. The height of the processing vessel 100 relative to the substrate support unit 200 is varied as the processing vessel 100 is vertically moved.

The lifting unit 600 includes a bracket 612, a movable shaft 614, and an actuator 616. The bracket 612 is fixedly attached to an outer wall of the processing vessel 100. The movable shaft 614 is fixedly coupled to the bracket 612 and is vertically moved by the actuator 616. When the substrate W is loaded onto a spin head 210 or unloaded from the spin head 210, the processing vessel 100 is lowered to allow the spin head 210 to further protrude beyond the processing vessel 100. Furthermore, during a process, the height of the processing vessel 100 is adjusted depending on the types of treatment liquids supplied onto the substrate W, to allow the treatment liquids to be introduced into the preset recovery bowls 110, 120, and 130, respectively. The vertical position of the processing vessel 100 relative to the substrate W is varied. The processing vessel 100 may vary the types of treatment liquids and pollutant gases recovered into the respective recovery spaces RS1, RS2, and RS3. According to an embodiment, the lifting unit 600 vertically moves the processing vessel 100 to vary the vertical position of the processing vessel 100 relative to the substrate support unit 200.

A liquid dispensing unit 360 includes a nozzle support rod 362, a nozzle 364, a support shaft 366, and an actuator 368.

The support shaft 366 is disposed such that the lengthwise direction thereof is parallel to the third direction 16, and the actuator 368 is coupled to a lower end of the support shaft 366. The actuator 368 rotates, raises, and lowers the support shaft 366. The nozzle support rod 362 is coupled perpendicular to an upper end of the support shaft 366 that is opposite to the lower end of the support shaft 366 to which the actuator 388 is coupled. The nozzle 364 is mounted on a bottom surface of a distal end of the nozzle support rod 362. The nozzle 364 is moved between a process position and a standby position by the actuator 368. The process position is a position where the nozzle 364 is located directly above the processing vessel 100, and the standby position is a position where the nozzle 364 deviates from directly above the processing vessel 100. The nozzle 364 dispenses a liquid onto the substrate W.

The substrate support unit 200 includes a spin head 210, a rotary shaft 220, an actuator 230, a backside nozzle assembly 240, and a sealing member 250.

The rotary shaft 220 connected to the spin head 210 is rotated by the actuator 230, and accordingly the substrate W mounted on the spin head 210 is rotated. The backside nozzle assembly 240 axially inserted through the rotary shaft 220 dispenses a chemical to the backside of the substrate W. The spin head 210 has a support member that supports the substrate W spaced apart upward from the spin head 210. The support member includes a plurality of chucking pins 211 that protrude upward from an edge portion of an upper surface of the spin head 210 and that are spaced apart from each other at predetermined intervals and a plurality of support pins 222 that are installed inward of the chucking pins 211 and that protrude upward from the upper surface of the spin head 210. The rotary shaft 220 is connected to the spin head 210. The rotary shaft 220 has a hollow shaft shape and transmits the torque of the actuator 230, which will be described below, to the spin head 210.

The heating unit 290 is installed inside the substrate support unit 200. For convenience, the heating unit 290 is omitted from the sectional view. The heating unit 290 may heat the substrate W during a cleaning process. The heating unit 290 may be installed inside the spin head 210. A plurality of heating units 290 may be provided. The heating units 290 may have different diameters. The heating units 290 may have a ring shape. For example, the heating units 290 may be implemented with a plurality of lamps in a ring shape. The heating units 290 may be subdivided into a plurality of concentric sections. The lamps may be provided in the sections to individually heat the sections, respectively. The lamps may be concentrically arranged at different radii with respect to the center of the spin head 210.

Figure 4:
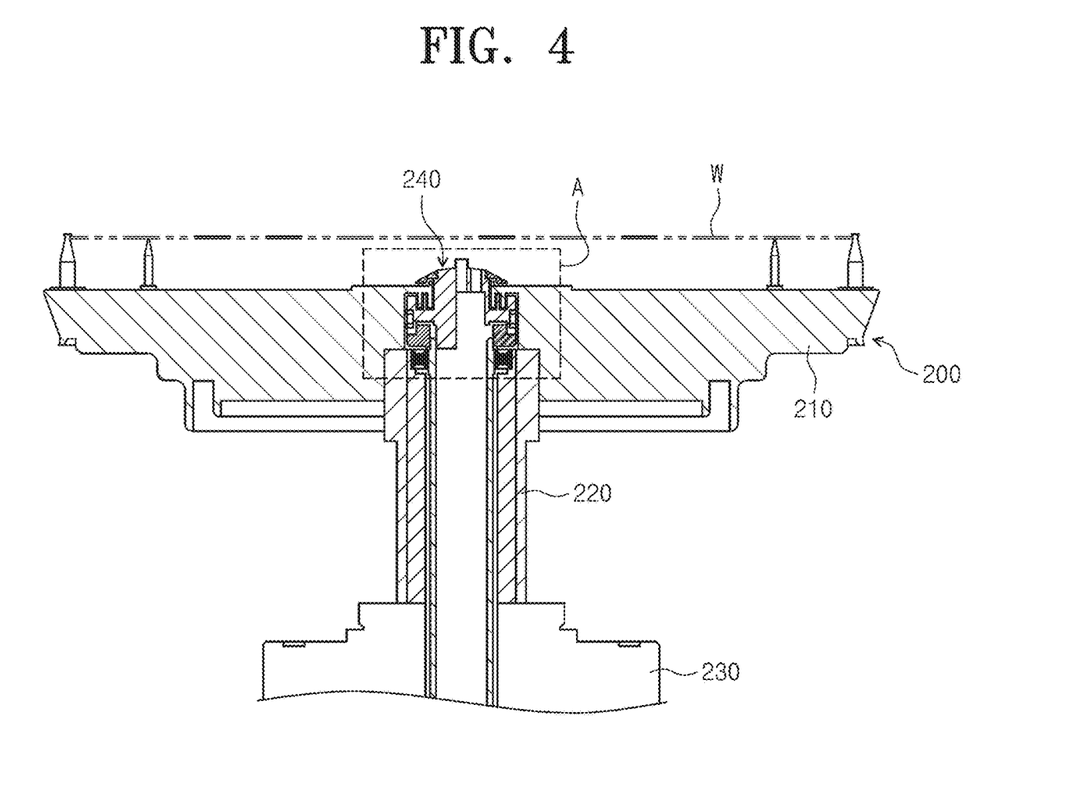
FIG. 4 is a view illustrating a substrate support unit and a backside nozzle assembly of FIG. 3.
Figure 5:
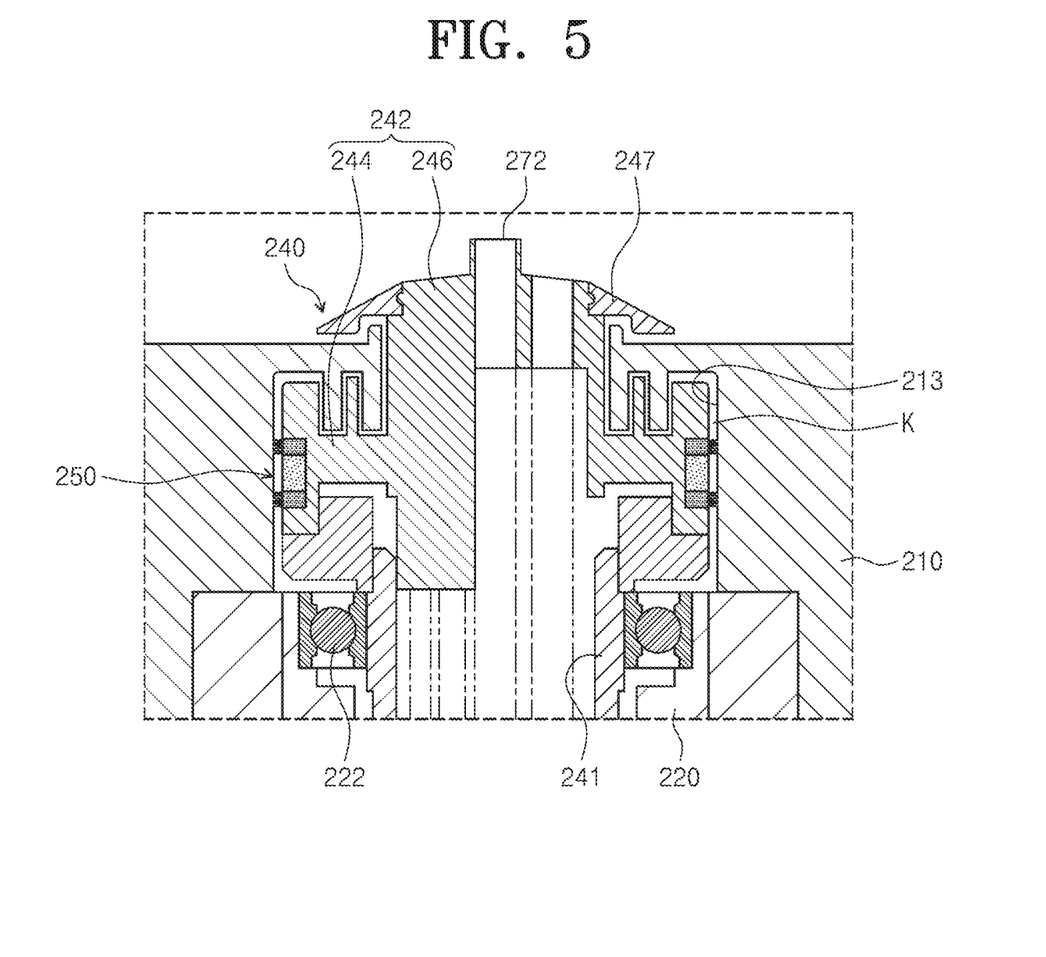
FIG. 5 is a blowup of detail A in FIG. 4.
Figure 6:
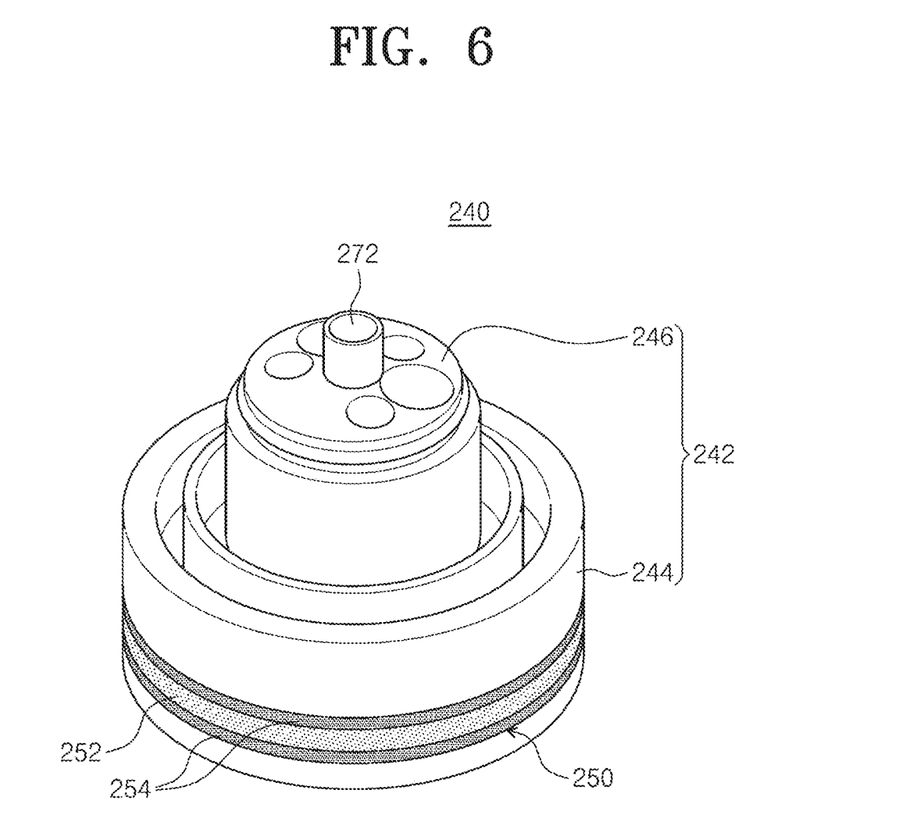
FIG. 6 is a perspective view illustrating the backside nozzle assembly.
Figure 7:
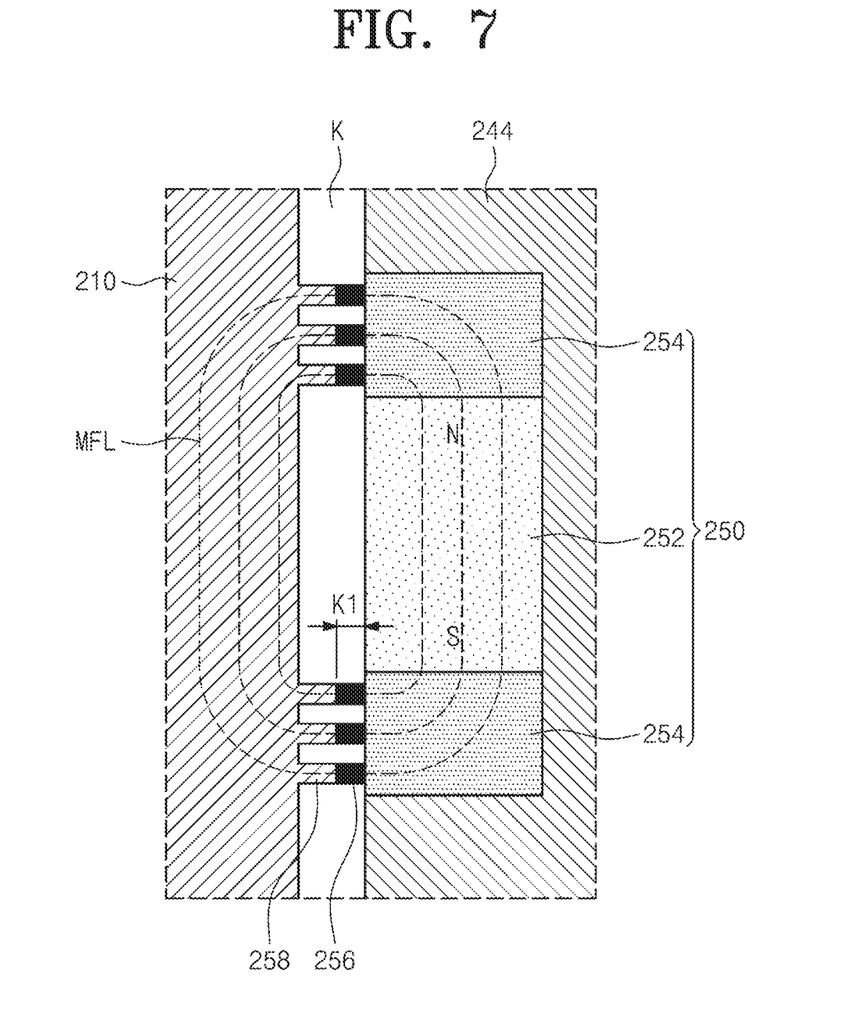
FIG. 7 is an enlarged view illustrating a sealing member.

FIG. 4 is a view illustrating the substrate support unit and the backside nozzle assembly of FIG. 3. FIG. 5 is a blowup of detail A in FIG. 4. FIG. 6 is a perspective view illustrating the backside nozzle assembly. FIG. 7 is an enlarged view illustrating the sealing member.

Referring to FIGS. 4 to 8, the backside nozzle assembly 240 is installed in hollow portions of the spin head 210 and the rotary shaft 220. The backside nozzle assembly 240 is supported by a bearing provided inside the rotary shaft 220. Accordingly, during a process, the spin head 210 and the rotary shaft 220 are rotated by the actuator 230, whereas the backside nozzle assembly 240 is not rotated.

The backside nozzle assembly 240 may include a main body 242 and a nozzle shaft 241.

The main body 242 may be located in the hollow portion of the spin head 210. The main body 242 may include a body 244 and a nozzle head 246.

The nozzle shaft 241 having a hollow shape may be coupled to a lower end of the body 244. A hollow portion in the nozzle shaft 241 may be connected with a hollow portion in the body 244. The nozzle shaft 241 is inserted into the hollow portion of the rotary shaft 220. A bearing 222 is installed between the nozzle shaft 241 and the rotary shaft 220. An outer race of the bearing 222 is fixedly inserted into the rotary shaft 220, and the nozzle shaft 241 is fixedly inserted into an inner race of the bearing 222. The rotary shaft 220 is rotated by the actuator 230, whereas the nozzle shaft 241 is not rotated because the nozzle shaft 241 is fixedly inserted into the inner race of the bearing 222.

A nozzle cap 247 may be installed on the nozzle head 246. The nozzle cap 247 has an umbrella shape and covers part of the upper surface of the spin head 210.

A backside nozzle 272 that dispenses a treatment liquid to the backside of the substrate W is provided in the hollow portions of the main body 242 and the nozzle shaft 241 and is inserted into the main body 242 such that an upper end of the backside nozzle 272 further protrudes upward beyond the nozzle head 246.

Due to the above-described coupling relationship, the spin head 210 and the rotary shaft 220 are rotated, whereas the backside nozzle assembly 240 is not rotated.

The sealing member 250 is an apparatus that seals the gap (clearance) K between the main body 242 and the spin head 210 using a magnetic fluid.

For example, the sealing member 250 may include a magnetic body 252 serving as a magnetic flux generation means, pole pieces 254 serving as magnetic flux transmission means, and a magnetic fluid 256. The magnetic body 252 may be implemented with a permanent magnet for forming magnetism and may be installed on an outer surface of the body 244. The body 244 may have a mounting groove formed on the outer surface thereof along the circumferential direction, and the magnetic body 252 and the pair of pole pieces 254 may have a ring shape and may be mounted in the mounting groove.

The pair of pole pieces 254 are located at upper and lower ends of the magnetic body 252 to transmit a magnetic flux line (MFL) of the magnetic body 252 to the spin head 210. The pole pieces 254 are formed of a magnetic material.

The magnetic fluid 256 seals the gap between the pole pieces 254 and the spin head 210 by a magnetic force transmitted by the pole pieces 254.

The magnetic fluid 256 is held in the gap K, which is formed between the pair of pole pieces 254 and an inner surface 213 of the hollow portion of the spin head 210, by the magnetic flux generated by the magnetic body 252. The magnetic fluid 256 may be exemplified by a well-known magnetic fluid obtained by dispersing ultra-fine magnetic particles in a solvent or oil using a surfactant and may have a property of being trapped in a magnetic field by moving along magnetic flux. The magnetic fluid 256 may ensure sealing efficiency between the pole pieces 254 and the inner surface 213 of the hollow portion of the spin head 210.

Meanwhile, the spin head 210 may include inward protrusions 258 that have a ring shape and that protrude from the inner surface 213 of the hollow portion of the spin head 210 that faces the pole pieces 254. The inward protrusions 258 may protrude from the inner surface 213 of the hollow portion of the spin head 210, which faces the pole pieces 254, to make the magnetic flux line (MFL) of the magnetic body 252. Accordingly, the magnetic fluid 256 may be more stably held in the gap K. For reference, the magnetic fluid 256 is held between the inward protrusions 258 and the pole pieces 254. Because the clearance K1 between the inward protrusions 258 and the pole pieces 254 is narrower than the gap K between the spin head 210 and the backside nozzle assembly 240, more effective sealing is possible, and a phenomenon in which the magnetic fluid 256 flows down may be minimized. If there are no inward protrusions, the magnetic fluid 256 may be widely held on the entire surfaces of the pole pieces 254, and therefore sealing efficiency may be relatively lowered.

In this embodiment, three inward protrusions 258 for each of the pole pieces 254, that is, a total of six inward protrusions 258 are formed along the clearance, and thus a remarkable effect of providing a six-layer sealing structure may be achieved. That is, a multiple sealing structure may be implemented with an increase in the number of inward protrusions 258.

As described above, the inventive concept may effectively prevent contamination of the substrate W due to a reverse flow of contaminated particles generated in the clearance between the spin head 210 and the backside nozzle assembly 240 and corrosion and contamination of the bearing 222 due to infiltration of a chemical through the clearance.

Figure 8:
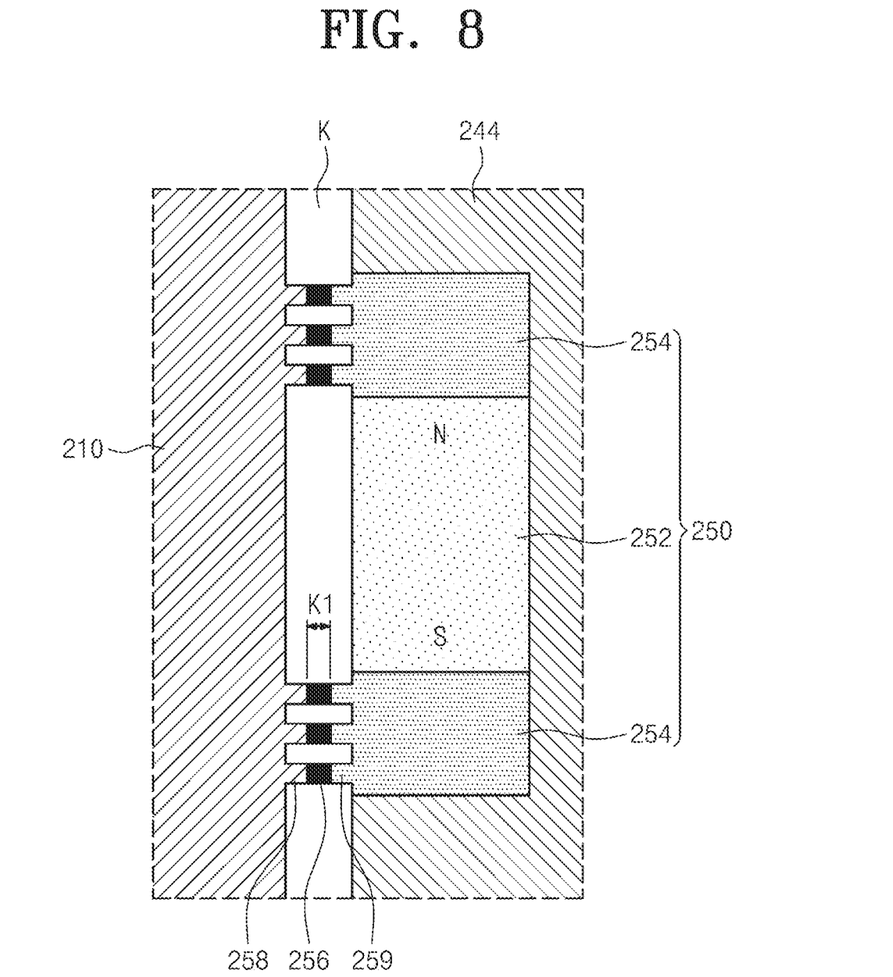
FIG. 8 is a view illustrating another embodiment of the sealing member.

FIG. 8 is a view illustrating another embodiment of the sealing member.

As illustrated in FIG. 8, the sealing member is characterized in that the pole pieces 254 include outward protrusions 259 protruding from outer surfaces of the pole pieces 254, which face the inward protrusions 258, to make the magnetic flux line of the magnetic body 252. The magnetic fluid 256 is located between the inward protrusions 258 and the outward protrusions 259.

As described above, according to the embodiments of the inventive concept, infiltration of a chemical into the gap between the spin head and the backside nozzle assembly may be blocked in a non-contact manner, and thus contamination of the bearing may be prevented.

According to the embodiments of the inventive concept, the gap between the spin head and the backside nozzle assembly may be sealed by the magnetic fluid. Accordingly, particles generated from the bearing may be prevented from flowing backward to the substrate, and thus contamination of the substrate may be prevented.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for supporting a substrate, the apparatus comprising:
   a rotatable spin head configured to support the substrate;
   a hollow shaft connected with the spin head and configured to transmit torque to the spin head;
   a nozzle assembly disposed in an interior space of the spin head so as not to rotate and configured to supply a treatment liquid to a backside of the substrate; and
   a sealing member configured to seal a gap between the spin head and the nozzle assembly using a magnetic fluid,
   wherein the sealing member includes,
      a magnetic body installed on a first member, the first member being one of a main body of the nozzle assembly and the spin head configured to surround the main body,
      pole pieces installed around the magnetic body and configured to transmit a magnetic force of the magnetic body to a second member, the second member being the other of the main body of the nozzle assembly and the spin head, and
      a magnetic fluid provided between the second member and the pole pieces and configured to seal a gap between the second member and the pole pieces by the magnetic force transmitted by the pole pieces.

2. The apparatus of claim 1, wherein the spin head includes inward protrusions protruding from an inner surface of a hollow portion of the spin head to make a magnetic flux line of the magnetic body, the inner surface being configured to face the pole pieces.

3. The apparatus of claim 2, wherein the pole pieces include outward protrusions protruding from an outer surface of the magnetic body to make the magnetic flux line, the outer surface being configured to face the inward protrusions.

4. The apparatus of claim 2, wherein a gap between the inward protrusions and the pole pieces is narrower than the gap between the spin head and the nozzle assembly.

5. The apparatus of claim 1, wherein the pole pieces are provided at an upper end and a lower end of the magnetic body along a lengthwise direction of the hollow shaft.

6. An apparatus for treating a substrate, the apparatus comprising:
   a cup having a process space therein;
   a support unit configured to support the substrate in the process space; and
   a fluid supply unit configured to supply a treatment fluid to the substrate supported on the support unit,
   wherein the support unit includes:
   a rotatable spin head configured to support the substrate;
   a hollow shaft connected with the spin head and configured to transmit torque to the spin head;
   a back nozzle assembly disposed in an interior space of the spin head so as not to rotate and configured to supply a treatment liquid to a backside of the substrate; and
   a sealing member configured to seal a gap between the spin head and the back nozzle assembly using a magnetic fluid,
   wherein the sealing member includes,
      a magnetic body installed in a recess formed on an outer surface of a main body of the back nozzle assembly and configured to form a magnetic field,
      pole pieces installed around the magnetic body and configured to transmit a magnetic flux line of the magnetic body to the spin head, and
      a magnetic fluid configured to seal a gap between the pole pieces and the spin head by a magnetic force transmitted by the pole pieces.

7. The apparatus of claim 6, wherein the spin head includes inward protrusions protruding from an inner surface of a hollow portion of the spin head to make the magnetic flux line of the magnetic body, the inner surface being configured to face the pole pieces.

8. The apparatus of claim 7, wherein the pole pieces include outward protrusions protruding from an outer surface of the magnetic body to make the magnetic flux line, the outer surface being configured to face the inward protrusions.

9. The apparatus of claim 7, wherein a gap between the inward protrusions and the pole pieces is narrower than the gap between the spin head and the nozzle assembly, and
   wherein the pole pieces are provided at an upper and a lower end of the magnetic body along a lengthwise direction of the hollow shaft.

* * * * *